United States Patent
Bianchi et al.

(10) Patent No.: US 9,018,729 B2
(45) Date of Patent: Apr. 28, 2015

(54) ADJUSTABLE AVALANCHE DIODE IN AN INTEGRATED CIRCUIT

(71) Applicants: STMicroelectronics SA, Montrouge (FR); STMicroelectronics (Crolles 2) SAS, Crolles (FR)

(72) Inventors: Raul Andres Bianchi, Myans (FR); Pascal Fonteneau, Theys (FR)

(73) Assignees: STMicroelectronics (Crolles 2) SAS, Crolles (FR); STMicroelectronics SA, Montrouge (FR)

( * ) Notice: Subject to any disclaimer, the term of this patent is extended or adjusted under 35 U.S.C. 154(b) by 0 days.

(21) Appl. No.: 13/895,715

(22) Filed: May 16, 2013

(65) Prior Publication Data

US 2013/0328150 A1 Dec. 12, 2013

(30) Foreign Application Priority Data

Jun. 11, 2012 (FR) ...................................... 12 55433

(51) Int. Cl.

| | |
|---|---|
| *H01L 23/58* | (2006.01) |
| *H01L 31/0256* | (2006.01) |
| *H01L 27/144* | (2006.01) |
| *H01L 31/18* | (2006.01) |
| *H01L 29/66* | (2006.01) |
| *H01L 29/866* | (2006.01) |
| *H01L 29/06* | (2006.01) |

(52) U.S. Cl.
CPC .......... *H01L 31/0256* (2013.01); *H01L 27/144* (2013.01); *H01L 31/1892* (2013.01); *H01L 29/66113* (2013.01); *H01L 29/866* (2013.01); *H01L 29/0684* (2013.01)

(58) Field of Classification Search
None
See application file for complete search history.

(56) References Cited

U.S. PATENT DOCUMENTS

| | | | | |
|---|---|---|---|---|
| 3,945,028 | A  * | 3/1976 | Krishna et al. ................ | 327/374 |
| 6,274,918 | B1 | 8/2001 | Tsai | |
| 7,056,761 | B1 | 6/2006 | Vashchenko | |
| 8,497,167 | B1 * | 7/2013 | Vashchenko et al. ......... | 438/140 |
| 2013/0200488 | A1* | 8/2013 | Chung .......................... | 257/510 |
| 2014/0131764 | A1* | 5/2014 | Chung .......................... | 257/119 |

FOREIGN PATENT DOCUMENTS

DE 19810579 A1 1/1999

OTHER PUBLICATIONS

Ker et al. Ultra-High-Voltage Charge Pump Circuit in Low-Voltage Bulk CMOS Processes With Polysilicon Diodes. Jan. 2007. IEEE Transactions on Circuits and Systems—II: Express Briefs. vol. 54, No. 1. pp. 47-51.*

* cited by examiner

*Primary Examiner* — Hoang-Quan Ho
(74) *Attorney, Agent, or Firm* — Allen, Dyer, Doppelt, Milbrath & Gilchrist, P.A.

(57) ABSTRACT

An avalance diode including, between two heavily-doped regions of opposite conductivity types arranged at the surface of a semiconductor region, a lightly-doped region, with length L of the lightly-doped region between the heavily-doped regions approximately ranging between 50 and 200 nm.

3 Claims, 1 Drawing Sheet

ADJUSTABLE AVALANCHE DIODE IN AN INTEGRATED CIRCUIT

CROSS REFERENCE TO RELATED APPLICATION

This application is a translation of and claims the priority benefit of French patent application number 12/55433, filed on Jun. 11, 2012, entitled: "ADJUSTABLE AVALANCHE DIODE IN AN INTEGRATED CIRCUIT," which is hereby incorporated by reference to the maximum extent allowable by law.

BACKGROUND

1. Technical Field

The present disclosure relates to the field of avalanche diodes, which are especially used as protection diodes in integrated circuits.

2. Discussion of the Art

One of the current ways of obtaining a determined reference voltage or breakdown voltage in an integrated circuit consists in using a reverse-biased PN junction. The breakdown voltage or avalanche voltage is then essentially set by the doping level of the less heavily doped region. For the PR junction, and especially for the less heavily doped region, it is desired to use a region having a doing level existing in the manufacturing technology of the integrated circuit where this PN junction is to be inserted, to avoid having to use a specific technological step to manufacture the avalanche diode. It is thus not always possible to directly obtain the desired breakdown voltage.

The same issue arises all the more when several avalanche diodes are desired to be formed in an integrated circuit, such avalanche diodes having different determined breakdown voltages. The number of breakdown voltages which can be obtained is rather limited and such voltages are predetermined by the doping levels existing in the various integrated circuit manufacturing blocks.

There thus is a need, especially in the field of integrated circuits, for avalanche diodes having adjustable avalanche voltages without requiring the use of specific doping levels or of complex structures.

BRIEF SUMMARY

Thus, an embodiment provides an avalanche diode comprising, between two heavily-doped regions of opposite conductivity types arranged at the surface of a semiconductor region, a lightly-doped region, with length L of the lightly-doped region between the heavily-doped regions approximately ranging between 50 and 200 nm.

According to an embodiment, the lightly-doped region has a doping level ranging between $10^{14}$ and $10^{16}$ atoms/cm$^3$.

An embodiment provides an integrated circuit comprising several avalanche diodes such as hereabove, having different lengths L.

An embodiment provides a method for adjusting the breakdown voltage of an avalanche diode of the above type, comprising selecting by masking the distance between the two heavily-doped regions.

The foregoing and other features and benefits will be discussed in detail in the following non-limiting description of specific embodiments in connection with the accompanying drawings.

BRIEF DESCRIPTION OF THE DRAWINGS

As usual in the representation of integrated circuits, FIG. 1 is not to scale.

DETAILED DESCRIPTION

Figure 1:
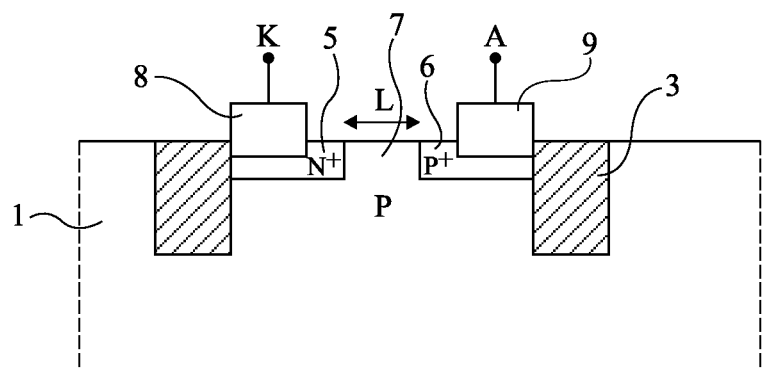
FIG. 1 is a simplified cross-section view of an embodiment of an adjustable avalanche diode.

FIG. 1 shows an avalanche diode comprising, in a region of a semiconductor substrate 1 preferably delimited by an insulating ring 3, respective heavily doped N-type regions and P-type regions 5 and 6 separated by a portion 7 of the substrate. Cathode contact K and anode contact A on regions 5 and 6 of the diode are taken in any conventional manner, for example, via metal suicide regions 8 and 9.

Call L the length of lightly-doped region 7 between the opposite limits of heavily-doped regions 5 and 6.

The inventors have noted that, when length L becomes smaller than approximately 250 nm, the diode has a breakdown voltage which essentially depends on length L and no longer essentially on the doping level of the less heavily doped region (the substrate).

Figure 2:
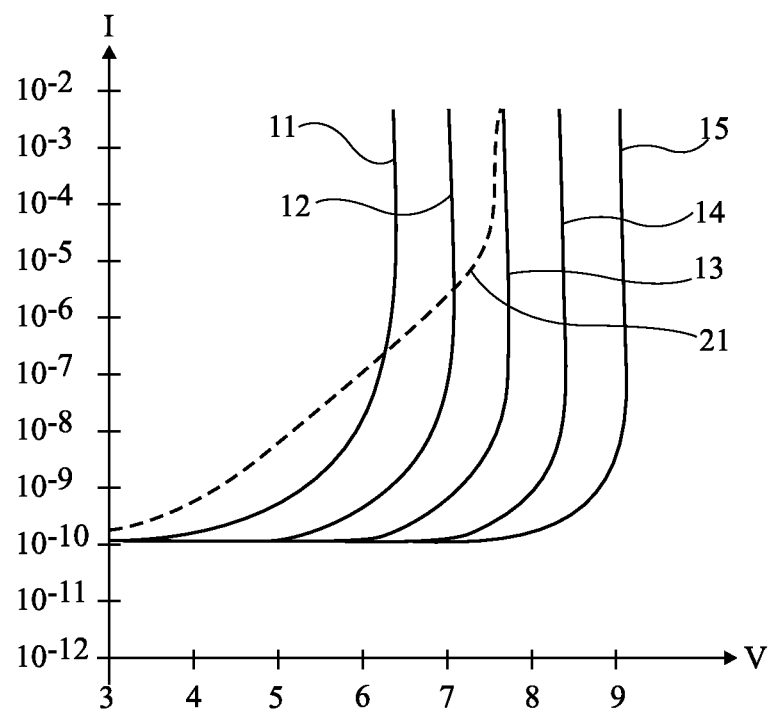
FIG. 2 shows various avalanche characteristics obtained with diodes of the type shown in FIG. 1.

Curves 11 to 15 of FIG. 2 show current versus reverse voltage characteristics for such a diode in the case where the substrate doping is on the order of $10^{15}$ at./cm$^3$. For respective values of length L of 0.12, 0.14, 0.16, 0.18, and 0.20 μm, the breakdown voltage varies between approximately 6 and approximately 9 volts. It should be noted that the avalanche knee point is strongly marked and the current-vs.-voltage characteristics become substantially vertical as soon as the current in the diode exceeds a value ranging between $10^{-7}$ and $10^{-9}$ amperes. In other words, the avalanche diode has a very small reverse-mode current leakage below the avalanche threshold.

However, if the substrate is more heavily doped, for example, if P substrate 1 is formed by a well such as currently used in integrated circuits, with a doping level approximately ranging between $10^{17}$ and $10^{18}$ at./cm$^3$, the same type of characteristics will be obtained with, however, a much more rounded knee point, as indicated by curve 21 for a 0.16-μm length L.

Thus, if an avalanche diode with little reverse-mode leakage is desired to be formed, it is desirable to use a lightly-doped substrate, preferably, having a doping level ranging between $10^{14}$ and $10^{16}$ at./cm$^3$.

It should be noted that the adjustment of the breakdown voltage of a diode such as described hereabove is particularly easy to obtain. Instead of resulting from technological diffusion and implantation operations aiming at obtaining specific doping levels, this adjustment only results from the shape of the mask(s) used to form the various regions, and especially regions 5 and 6 of FIG. 1 at a selected distance L from each other. According to this distance L, different breakdown voltages will be obtained.

Although N$^+$ and P$^+$ regions separated by a lightly-doped P-type substrate region have been described herein, this substrate region may be lightly N-type doped.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. An avalanche diode comprising:
   two heavily-doped regions of opposite conductivity types arranged at the surface of a semiconductor region; and a lightly-doped region, with length L of the lightly-doped region between the heavily-doped regions ranging between 120 and 200 nm, said lightly-doped region not being covered by a gate, wherein the lightly-doped region has a doping level ranging between $10^{17}$ and $10^{18}$ atoms/cm$^3$, and the reverse-mode current leakage up to the avalanche threshold occurs between 4.0 to 7.5 volts.

2. An integrated circuit, comprising:

a first avalanche diode comprising, between two first heavily-doped regions of opposite conductivity types arranged at the surface of a first semiconductor region, a first lightly-doped region, with length L of the first lightly-doped region between the heavily-doped regions ranging between 120 and 200 nm, said first lightly-doped region not being covered by a gate, wherein the first lightly-doped region has a doping level ranging between $10^{17}$ and $10^{18}$ atoms/cm$^3$, and the reverse-mode current leakage up to the avalanche threshold occurs between 4.0 to 7.5 volts; and a second avalanche diode comprising, between two second heavily-doped regions of opposite conductivity types arranged at the surface of a second semiconductor region, a second lightly-doped region, with second length L of the second lightly-doped region between the two second heavily-doped regions ranging between 120 and 200 nm, said second lightly-doped region not being covered by a gate, wherein the second lightly-doped region has a doping level ranging between $10^{17}$ and $10^{18}$ atoms/cm$^3$, wherein the second length is different than the first length.

3. A method for adjusting the breakdown voltage of the avalanche diode of claim 1, comprising selecting by masking the distance between the two heavily-doped regions.

* * * * *